(12) United States Patent
Hsu et al.

(10) Patent No.: US 10,553,633 B2
(45) Date of Patent: Feb. 4, 2020

(54) PHOTOTRANSISTOR WITH BODY-STRAPPED BASE

(71) Applicants: Klaus Y. J. Hsu, Hsinchu (TW); WISPRO TECHNOLOGY CONSULTING CORPORATION LIMITED, Kowloon (HK)

(72) Inventors: Klaus Y. J. Hsu, New Taipei (TW); Brett W. C. Liao, New Taipei (TW)

(73) Assignees: Klaus Y.J. Hsu, Hsinchu (TW); Wispro Technology Cosulting Corporation Limited, Kowloon (HK)

(*) Notice: Subject to any disclaimer, the term of this patent is extended or adjusted under 35 U.S.C. 154(b) by 0 days.

(21) Appl. No.: 14/291,009

(22) Filed: May 30, 2014

(65) Prior Publication Data
US 2015/0349186 A1  Dec. 3, 2015

(51) Int. Cl.
| H01L 31/10 | (2006.01) |
| H01L 31/11 | (2006.01) |
| H01L 27/146 | (2006.01) |
| H01L 31/0224 | (2006.01) |

(52) U.S. Cl.
CPC .... *H01L 27/1463* (2013.01); *H01L 27/14681* (2013.01); *H01L 27/14683* (2013.01); *H01L 31/10* (2013.01); *H01L 31/11* (2013.01); *H01L 31/1105* (2013.01)

(58) Field of Classification Search
CPC ...... H01L 31/10; H01L 31/11; H01L 31/1105; H01L 31/111; H01L 31/1113; H01L 31/1116; H01L 31/022458; H01L 31/0682; H01L 31/0684
See application file for complete search history.

(56) References Cited

U.S. PATENT DOCUMENTS

| 4,167,748 A * | 9/1979 | D'Angelo | H01L 27/0825 257/498 |
| 4,355,320 A * | 10/1982 | Tihanyi | H01L 31/1105 257/461 |
| 4,395,736 A * | 7/1983 | Fraleux | H04N 3/1512 250/214 LA |
| 4,409,606 A * | 10/1983 | Wagenaar | H01L 21/74 257/331 |
| 4,566,020 A * | 1/1986 | Shannon | H01L 29/41 257/26 |
| 4,587,546 A * | 5/1986 | Herberg | H01L 31/1113 257/114 |

(Continued)

FOREIGN PATENT DOCUMENTS

WO   WO 0249120 A1 *  6/2002  ......... H01L 31/101

OTHER PUBLICATIONS

"Ultra-Sensitive SiGe Bipolar Phototransistors for Optical Interconnects," Michael Roe, University of California t Berkeley, May 27, 2012.*

(Continued)

*Primary Examiner* — Maliheh Malek

(57) ABSTRACT

A photodetector includes a two-terminal bipolar phototransistor arranged on a substrate. The phototransistor includes a base, a collector, and an emitter. An electrical connection is made between the base and the local substrate near a region of the phototransistor. The electrical connection can be by way of metal interconnects.

12 Claims, 20 Drawing Sheets

(56) References Cited

U.S. PATENT DOCUMENTS

| | | | | | |
|---|---|---|---|---|---|
| 4,633,287 | A | * | 12/1986 | Yamazaki | H01L 27/14681 136/255 |
| 4,729,965 | A | * | 3/1988 | Tamaki | H01L 21/033 257/554 |
| 4,740,482 | A | * | 4/1988 | Hirao | H01L 21/28525 257/552 |
| 4,785,341 | A | * | 11/1988 | Ning | H01L 21/76889 257/554 |
| 4,847,668 | A | * | 7/1989 | Sugawa | H04N 3/1568 257/448 |
| 4,920,395 | A | * | 4/1990 | Muro | H01L 27/1443 257/257 |
| 5,003,371 | A | * | 3/1991 | Tailliet | G11C 17/18 257/146 |
| 5,013,670 | A | * | 5/1991 | Arikawa | H01L 31/02164 148/DIG. 152 |
| 5,027,182 | A | * | 6/1991 | Kim | G06N 3/0675 257/200 |
| 5,063,426 | A | * | 11/1991 | Chandrasekhar | H01L 27/1443 257/197 |
| 5,097,305 | A | * | 3/1992 | Mead | H01L 27/14681 257/292 |
| 5,101,252 | A | * | 3/1992 | Matsumoto | H01L 31/1105 250/578.1 |
| 5,126,814 | A | * | 6/1992 | Zakamura | H01L 31/1105 257/462 |
| 5,140,400 | A | * | 8/1992 | Morishita | H01L 27/14681 257/197 |
| 5,202,896 | A | * | 4/1993 | Taylor | H01L 27/15 257/12 |
| 5,241,169 | A | * | 8/1993 | Ohzu | H01L 27/14681 250/208.1 |
| 5,260,592 | A | * | 11/1993 | Mead | H01L 27/14681 250/370.01 |
| 5,323,031 | A | * | 6/1994 | Shoji | H01L 29/161 257/197 |
| 5,404,373 | A | * | 4/1995 | Cheng | G06E 1/04 257/E31.102 |
| 5,459,332 | A | * | 10/1995 | Carruthers | H01L 31/1105 257/17 |
| 5,483,096 | A | * | 1/1996 | Kuhara | H01L 31/1105 257/436 |
| 5,498,885 | A | * | 3/1996 | Deen | H01L 29/7393 257/139 |
| 5,501,998 | A | * | 3/1996 | Chen | H01L 27/10852 257/E21.648 |
| 5,525,826 | A | * | 6/1996 | Palara | H01L 27/0716 257/378 |
| 5,552,619 | A | * | 9/1996 | Bergemont | H01L 31/1105 257/291 |
| 5,565,701 | A | * | 10/1996 | Zambrano | H01L 27/0821 257/500 |
| 5,665,994 | A | * | 9/1997 | Palara | H01L 27/0623 257/378 |
| 5,682,120 | A | * | 10/1997 | Ito | H03F 3/45282 330/252 |
| 5,684,308 | A | * | 11/1997 | Lovejoy | H01L 27/1443 257/184 |
| 5,708,281 | A | * | 1/1998 | Morishita | H01L 27/14681 257/191 |
| 5,717,241 | A | * | 2/1998 | Malhi | H01L 27/0722 257/273 |
| 5,780,880 | A | * | 7/1998 | Enquist | H01L 29/7371 257/188 |
| 5,786,623 | A | * | 7/1998 | Bergemont | H01L 27/14681 257/291 |
| 5,837,574 | A | * | 11/1998 | Bergemont | H01L 21/823406 148/DIG. 10 |
| 5,886,387 | A | * | 3/1999 | Nishigohri | H01L 27/0623 257/205 |
| 5,942,783 | A | * | 8/1999 | Brambilla | H01L 27/0664 257/147 |
| 5,998,855 | A | * | 12/1999 | Patti | H01L 29/7304 257/578 |
| 5,999,553 | A | * | 12/1999 | Sun | H01S 5/4043 372/23 |
| 6,043,519 | A | * | 3/2000 | Shealy | H01L 21/8252 257/192 |
| 6,198,154 | B1 | * | 3/2001 | Pinto | H01L 27/0823 257/557 |
| 6,225,670 | B1 | * | 5/2001 | Dierickx | H01L 27/14601 257/431 |
| 6,229,189 | B1 | * | 5/2001 | Yap | H01L 31/12 257/414 |
| 6,239,477 | B1 | * | 5/2001 | Johnson | H01L 21/28518 257/592 |
| 6,255,709 | B1 | * | 7/2001 | Marso | H01L 27/146 257/431 |
| 6,303,919 | B1 | * | 10/2001 | Yokomichi | H01L 27/14609 250/208.1 |
| 6,380,531 | B1 | * | 4/2002 | Sugihwo | B82Y 20/00 250/214.1 |
| 6,396,107 | B1 | * | 5/2002 | Brennan | H01L 27/0255 257/197 |
| 6,441,446 | B1 | * | 8/2002 | Patti | H01L 27/0705 257/378 |
| 6,479,844 | B2 | * | 11/2002 | Taylor | B82Y 20/00 257/192 |
| 6,555,852 | B1 | * | 4/2003 | Krutsick | H01L 21/8249 257/197 |
| 6,597,011 | B1 | * | 7/2003 | Atanackovic | B82Y 20/00 257/12 |
| 6,703,647 | B1 | * | 3/2004 | Garcia | H01L 31/1105 257/108 |
| 6,727,530 | B1 | * | 4/2004 | Feng | H01L 21/8252 257/184 |
| 6,858,509 | B2 | * | 2/2005 | Delage | H01L 29/7371 257/E21.387 |
| 6,974,969 | B2 | * | 12/2005 | Taylor | H01L 29/155 257/24 |
| 7,035,487 | B2 | * | 4/2006 | Samara-Rubio | G02F 1/025 385/1 |
| 7,095,084 | B2 | * | 8/2006 | Ronsisvalle | H03K 17/04166 257/378 |
| 7,286,583 | B2 | * | 10/2007 | Feng | B82Y 20/00 372/30 |
| 7,345,310 | B2 | * | 3/2008 | Agarwal | H01L 29/1004 257/197 |
| 7,385,230 | B1 | * | 6/2008 | Taylor | H01L 27/0605 257/107 |
| 7,535,034 | B2 | * | 5/2009 | Walter | H01L 33/04 257/13 |
| 7,551,826 | B2 | * | 6/2009 | Taylor | G02B 6/1228 257/183 |
| 7,657,131 | B2 | * | 2/2010 | Liu | G02F 1/2257 385/4 |
| 7,776,753 | B2 | * | 8/2010 | Taylor | H03M 1/74 438/712 |
| 7,816,221 | B2 | * | 10/2010 | John | H01L 29/0649 257/E21.042 |
| 7,932,541 | B2 | * | 4/2011 | Joseph | H01L 29/0817 257/198 |
| 7,998,807 | B2 | * | 8/2011 | Feng | H01L 33/0016 257/183 |
| 8,062,919 | B2 | * | 11/2011 | Apsel | H01L 27/14 257/257 |
| 8,183,612 | B2 | * | 5/2012 | Chong | H01L 31/1075 257/184 |
| 8,227,832 | B2 | * | 7/2012 | Chiu | H01L 29/0692 257/156 |
| 8,378,457 | B2 | * | 2/2013 | Chen | H01L 29/7378 257/197 |
| 8,421,185 | B2 | * | 4/2013 | Chiu | H01L 21/743 257/342 |
| 8,455,975 | B2 | * | 6/2013 | Liu | H01L 21/743 257/197 |
| 8,509,274 | B2 | * | 8/2013 | Walter | B82Y 20/00 257/13 |

(56) References Cited

U.S. PATENT DOCUMENTS

| | | | | |
|---|---|---|---|---|
| 8,675,272 B2* | 3/2014 | Cho | | G01S 7/4816 359/238 |
| 8,759,880 B2* | 6/2014 | Shi | | H01L 29/737 257/197 |
| 8,803,279 B2* | 8/2014 | Qian | | H01L 29/737 257/499 |
| 8,946,041 B2* | 2/2015 | Lin | | H01L 29/0804 257/E29.187 |
| 8,947,925 B2* | 2/2015 | Taylor | | G11C 13/0004 365/163 |
| 8,956,945 B2* | 2/2015 | Dunn | | H01L 29/66242 257/E21.608 |
| 9,324,846 B1* | 4/2016 | Camillo-Castillo | | H01L 29/7371 |
| 9,368,537 B1* | 6/2016 | Holmes | | H01L 27/14636 |
| 9,786,652 B2* | 10/2017 | Zhan | | H01L 27/0262 |
| 9,911,627 B1* | 3/2018 | Or-Bach | | H01L 23/49827 |
| 2001/0015470 A1* | 8/2001 | Gregory | | H01L 21/761 257/511 |
| 2001/0017398 A1* | 8/2001 | Alagi | | H01L 27/0214 257/560 |
| 2002/0123178 A1* | 9/2002 | Ejiri | | H01L 27/1443 438/152 |
| 2003/0011001 A1* | 1/2003 | Chevalier | | H01L 29/66242 257/197 |
| 2003/0015720 A1* | 1/2003 | Lian | | G02B 6/43 257/98 |
| 2003/0034491 A1* | 2/2003 | Lempkowski | | H01L 21/8221 257/55 |
| 2003/0036259 A1* | 2/2003 | Tate | | H01L 21/8258 438/622 |
| 2003/0085442 A1* | 5/2003 | Georgescu | | H01L 21/761 257/500 |
| 2003/0087466 A1* | 5/2003 | Wang | | H01L 31/1105 438/45 |
| 2003/0102506 A1* | 6/2003 | Loddenkotter | | H01L 23/5386 257/341 |
| 2003/0102509 A1* | 6/2003 | Hu | | H01L 27/027 257/361 |
| 2004/0041235 A1* | 3/2004 | Yanagihara | | H01L 29/0817 257/565 |
| 2004/0067609 A1* | 4/2004 | Lee | | H01L 27/0262 438/133 |
| 2004/0097049 A1* | 5/2004 | Kawai | | H01L 21/8249 438/314 |
| 2005/0007323 A1* | 1/2005 | Appelbaum | | H01L 27/15 345/87 |
| 2005/0079658 A1* | 4/2005 | Li | | H01L 29/0817 438/189 |
| 2006/0011943 A1* | 1/2006 | Howard | | H01L 29/0649 257/197 |
| 2006/0014334 A1* | 1/2006 | Augusto | | H01L 21/84 438/154 |
| 2006/0141651 A1* | 6/2006 | Taylor | | H03M 1/74 438/47 |
| 2006/0226446 A1* | 10/2006 | Ohnishi | | H01L 29/66242 257/197 |
| 2007/0023865 A1* | 2/2007 | Mueller | | H01L 21/2257 257/565 |
| 2007/0030871 A1* | 2/2007 | Lee | | B82Y 20/00 372/46.01 |
| 2007/0045664 A1* | 3/2007 | Miura | | H01L 29/7378 257/197 |
| 2007/0085167 A1* | 4/2007 | Saitoh | | H01L 29/66242 257/565 |
| 2007/0108555 A1* | 5/2007 | Lenoble | | H01L 29/0821 257/592 |
| 2007/0145378 A1* | 6/2007 | Agarwal | | H01L 29/1004 257/77 |
| 2007/0164393 A1* | 7/2007 | Bach | | H01L 27/144 257/528 |
| 2007/0187795 A1* | 8/2007 | Langguth | | H01L 27/14681 257/458 |
| 2007/0241377 A1* | 10/2007 | Goushcha | | H01L 27/1463 257/292 |
| 2007/0269968 A1* | 11/2007 | Saxler | | H01L 21/3245 438/522 |
| 2008/0173879 A1* | 7/2008 | Monaco | | H01L 25/167 257/84 |
| 2008/0237656 A1* | 10/2008 | Williams | | H01L 21/761 257/262 |
| 2009/0020841 A1* | 1/2009 | Hu | | H01L 31/105 257/442 |
| 2009/0032896 A1* | 2/2009 | Taniguchi | | H01L 31/1105 257/462 |
| 2009/0045479 A1* | 2/2009 | Bae | | H01L 27/14603 257/443 |
| 2009/0050998 A1* | 2/2009 | Miura | | H01L 31/1105 257/461 |
| 2009/0058843 A1* | 3/2009 | Ishizuka | | G09G 3/3233 345/213 |
| 2009/0129724 A1* | 5/2009 | Carter | | H01L 27/3269 385/14 |
| 2009/0140367 A1* | 6/2009 | Iwai | | H01L 31/10 257/462 |
| 2009/0152664 A1* | 6/2009 | Klem | | H01L 27/14603 257/440 |
| 2009/0230498 A1* | 9/2009 | Iwai | | H01L 27/1443 257/461 |
| 2009/0289279 A1* | 11/2009 | Khare | | H01L 21/8249 257/190 |
| 2009/0321788 A1* | 12/2009 | John | | H01L 29/0649 257/197 |
| 2009/0321880 A1* | 12/2009 | Aoki | | H01L 29/1004 257/591 |
| 2010/0002115 A1* | 1/2010 | Liu | | H01L 27/14634 348/308 |
| 2010/0032804 A1* | 2/2010 | Balster | | H01L 21/76283 257/586 |
| 2010/0085995 A1* | 4/2010 | Feng | | H01S 5/06203 372/43.01 |
| 2010/0148214 A1* | 6/2010 | Terashima | | H01L 27/0623 257/139 |
| 2010/0171148 A1* | 7/2010 | Liu | | H01L 27/0262 257/133 |
| 2010/0176420 A1* | 7/2010 | Yao | | H01L 31/11 257/187 |
| 2010/0187657 A1* | 7/2010 | Boeck | | H01L 29/0649 257/593 |
| 2010/0237455 A1* | 9/2010 | Lee | | H01L 31/1105 257/462 |
| 2010/0289427 A1* | 11/2010 | Walter | | B82Y 20/00 315/291 |
| 2010/0301442 A1* | 12/2010 | Iwai | | H01L 31/022416 257/437 |
| 2010/0301820 A1* | 12/2010 | Kaneko | | H01L 29/7393 323/282 |
| 2010/0321755 A1* | 12/2010 | Cho | | G01S 7/4816 359/248 |
| 2011/0031578 A1* | 2/2011 | Miura | | H01L 21/02381 257/462 |
| 2011/0147892 A1* | 6/2011 | Chiu | | H01L 21/76232 257/565 |
| 2011/0193133 A1* | 8/2011 | Ogura | | H01L 27/1446 257/184 |
| 2012/0091509 A1* | 4/2012 | Liu | | H01L 29/0821 257/197 |
| 2012/0129301 A1* | 5/2012 | Or-Bach | | H01L 21/6835 438/129 |
| 2012/0181579 A1* | 7/2012 | Chen | | H01L 29/0821 257/197 |
| 2013/0075746 A1* | 3/2013 | Mallikarjunaswamy | | H01L 29/735 257/75 |
| 2013/0126945 A1* | 5/2013 | Liu | | H01L 29/66242 257/197 |

(56) References Cited

U.S. PATENT DOCUMENTS

| | | | | |
|---|---|---|---|---|
| 2013/0214275 A1* | 8/2013 | Adkisson | H01L 29/66234 | 257/51 |
| 2013/0234277 A1* | 9/2013 | Negoro | H01L 27/14681 | 257/443 |
| 2013/0270610 A1* | 10/2013 | Suess | H01L 27/14643 | 257/258 |
| 2013/0285121 A1* | 10/2013 | Zampardi, Jr. | H01L 29/73 | 257/197 |
| 2013/0288447 A1* | 10/2013 | Cai | H01L 29/66242 | 438/311 |
| 2014/0050242 A1* | 2/2014 | Taylor | H01L 29/0688 | 372/45.012 |
| 2014/0264453 A1* | 9/2014 | Moens | H01L 29/66462 | 257/194 |
| 2014/0284552 A1* | 9/2014 | Kub | H01L 29/66242 | 257/26 |
| 2014/0326295 A1* | 11/2014 | Moslehi | H01L 31/18 | 136/249 |
| 2014/0353725 A1* | 12/2014 | Adkisson | H01L 29/737 | 257/197 |
| 2014/0353799 A1* | 12/2014 | Hwang | H01L 29/732 | 257/577 |
| 2015/0014632 A1* | 1/2015 | Kim | H01L 33/0004 | 257/24 |
| 2015/0069338 A1* | 3/2015 | Cho | H01L 27/3265 | 257/40 |
| 2015/0102384 A1* | 4/2015 | Zhan | H01L 27/0262 | 257/173 |
| 2015/0145005 A1* | 5/2015 | Dinh | H01L 29/735 | 257/197 |
| 2015/0187752 A1* | 7/2015 | Salman | H01L 27/0259 | 257/526 |
| 2015/0263115 A1* | 9/2015 | Hiyoshi | H01L 29/402 | 257/77 |
| 2015/0349186 A1* | 12/2015 | Hsu | H01L 31/1129 | 257/291 |
| 2016/0070078 A1* | 3/2016 | Budd | G02B 6/43 | 385/14 |
| 2016/0099372 A1* | 4/2016 | Lee | H01L 27/14614 | 250/208.1 |
| 2016/0240634 A1* | 8/2016 | Okawa | H01L 29/735 | |
| 2016/0365284 A1* | 12/2016 | Taylor | H01L 21/8249 | |
| 2016/0379936 A1* | 12/2016 | Spitzlsperger | H01L 21/76898 | 257/139 |
| 2018/0277703 A1* | 9/2018 | Yao | H01L 31/1105 | |

OTHER PUBLICATIONS

"PNP PIN Bipolar Phototransistors for High-Speed Applications Built in a 180 nm CMOS Process," Kostov et al., Vienna, Austria, 2012.*

Name of the author: Klaus Y. J. Hsu and Brett W. C. Liao Title of the article: High Responsivity Phototransistor with Body-strapped Base in Standard SiGe BiCMOS Technology Title of the item: Electron Devices and Solid-State Circuits (EDSSC), 2013 IEEE International Conference of Electron Devices and Solid-state Circuits Date of Conference: Jun. 3-5, 2013 Conference Location: Hong Kong, China.

* cited by examiner

PHOTOTRANSISTOR WITH BODY-STRAPPED BASE

FIELD

Embodiments of the present disclosure relate to semiconductor devices, and particularly to a photodetector semiconductor device.

BACKGROUND

Bipolar phototransistors can operate in either three-terminal configuration or two-terminal configuration. When operating in three-terminal configuration, the current gain of the phototransistor is high but the dark current is large since a large steady-state bias current may exist in the device, which increases steady-state power consumption and requires techniques for extracting photo-current out of the total current (dark current plus photo-current). On the other hand, when operating in two-terminal configuration, the base is floating. Therefore, the dark current is extremely low, but the current gain is not as high as that of three-terminal configuration. Therefore there is room for improvement in the art.

BRIEF DESCRIPTION OF THE DRAWINGS

Implementations of the present technology will now be described, by way of example only, with reference to the attached figures.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
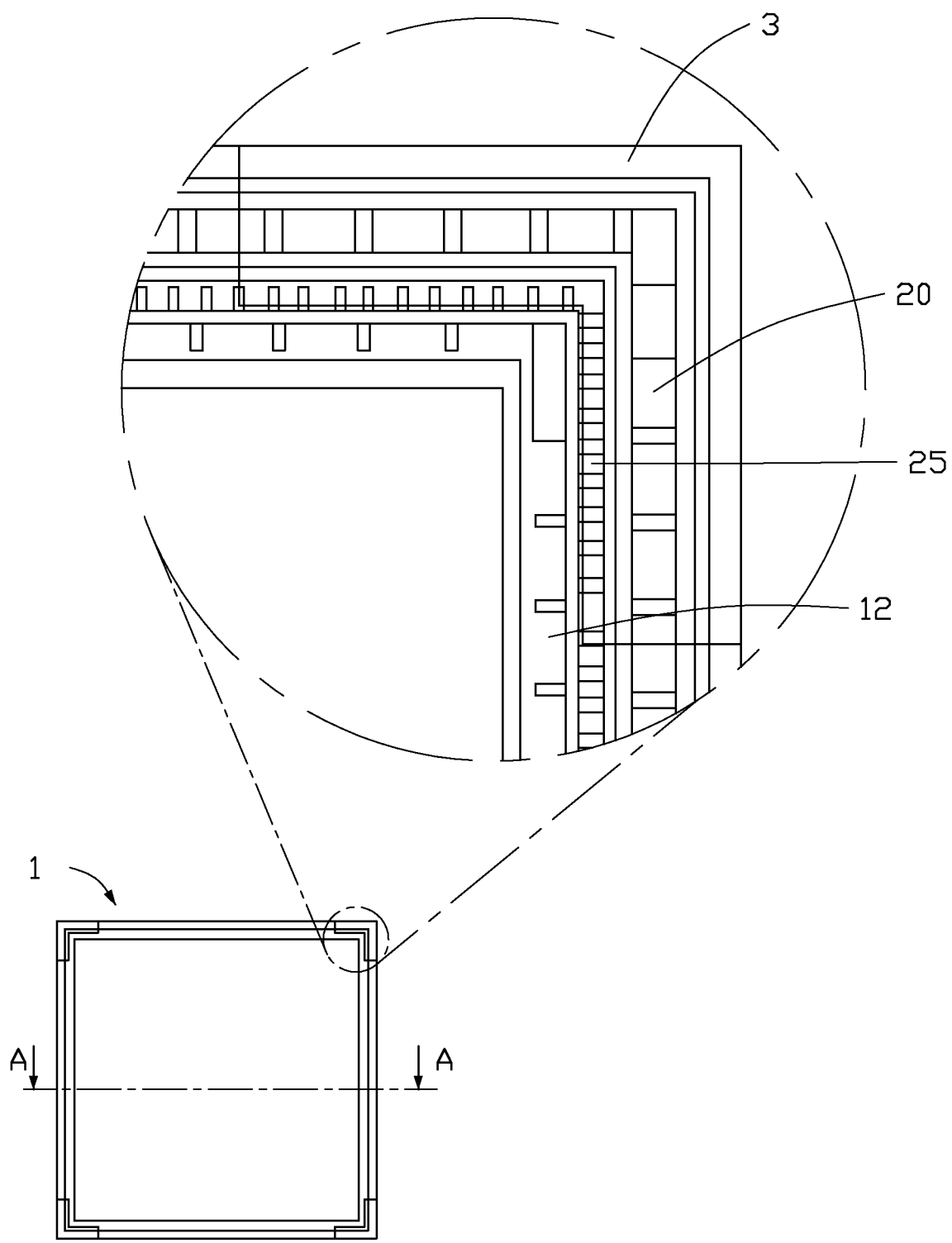
FIG. 1 is a top plan view of a photodetector structure having a bipolar phototransistor with body strapped base in accordance with a first embodiment of the present disclosure.

FIG. 1 shows a top plan view of a first embodiment of photodetector comprising a phototransistor 1 in accordance with the disclosure. The phototransistor 1 is a layered structure having the standard silicon-germanium (SiGe) heterojunction bipolar transistor (HBT). As shown in FIG. 1, the phototransistor 1 comprises a substrate region 3 (or can be referred to as substrate 3), a collector region 20 (or collector 20), a base region 25 (or base 25), and an emitter region 12 (or emitter 12). The device shown in FIG. 1 is a 60 µm×60 µm square form. As is apparent, the emitter region 12 covers only a small portion of the device area.

Figure 2:
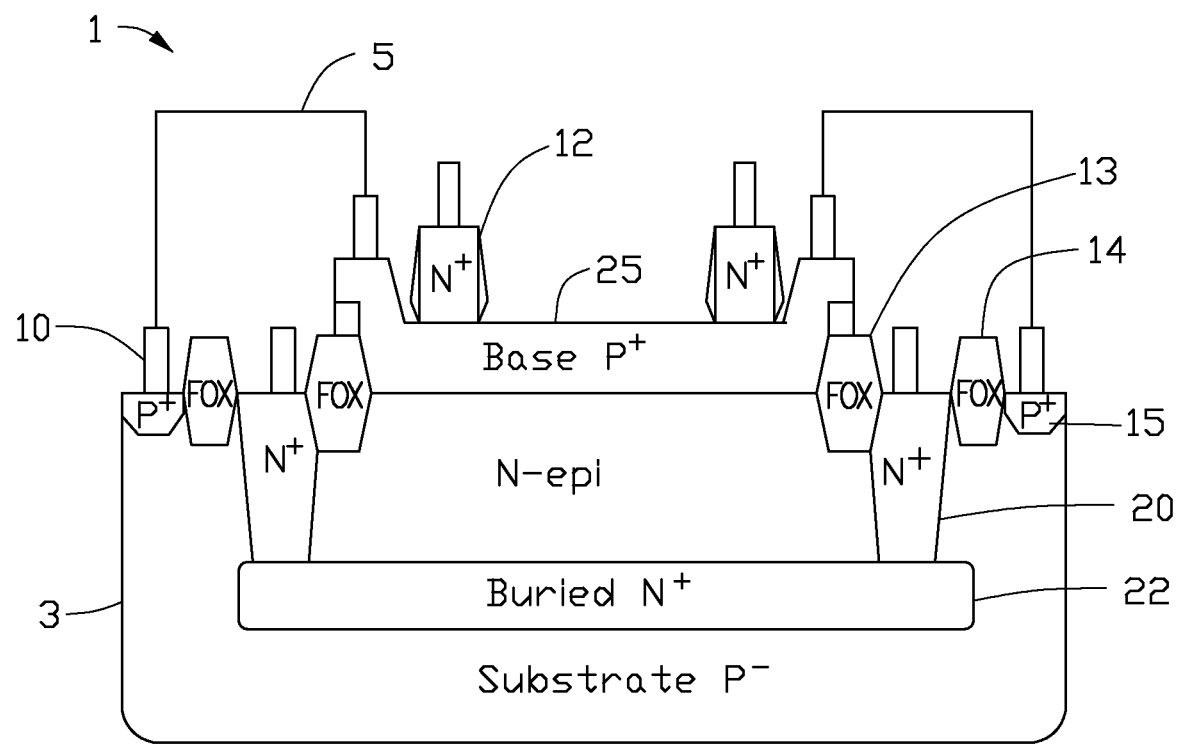
FIG. 2 is a cross-sectional view taken along line A-A of FIG. 1.

FIG. 2 depicts a cross-sectional view of the phototransistor 1 depicted in FIG. 1 along line A-A of FIG. 1. Like-numbered elements described above also refer to the same elements depicted in FIG. 2. As shown in FIG. 2, phototransistor 1 includes semiconductor substrate region 3. The semiconductor substrate 3 is of p-type conductivity. Included in the substrate region 3 is a buried layer 22. The buried layer 22 is of n-type conductivity. Disposed adjacent to the buried layer 22 is an epitaxial region N-epi that is of n-type conductivity. The buried layer 22 contains a higher doping concentration, for example 1019/cm3-1021/cm3, than that of the epitaxial region N-epi. Disposed adjacent to the N-epi region are collector regions 20. The collector regions 20 are of n-type conductivity and contain a higher doping level than that of the N-epi region.

A semiconductor layer of p-type conductivity overlies the N-epi region and forms the base region 25 of the phototransistor 1 of FIG. 2. A plurality of field oxides FOX 13 are disposed between the collector region 20 and the base region 25.

As shown in FIG. 2, doping regions 15 are formed in the substrate of the phototransistor 1. Field oxides FOX 14 are formed separating and abutting the doping regions 15 and the collector regions 20. An emitter region 12 made of polysilicon is partially formed over the base region 25. This avoids the light power degradation by the polysilicon. The emitter region 12 is of n-type conductivity and of higher doping concentration than the N-epi region. A plurality of metal contacts 10 are disposed on the doping regions 15, the collector regions 20, the base region 25, and the emitter region 12. The doping regions 15 are electrically connected to the base region 25 using metal interconnects 5 connected to the metal contacts 10.

Figure 3A:
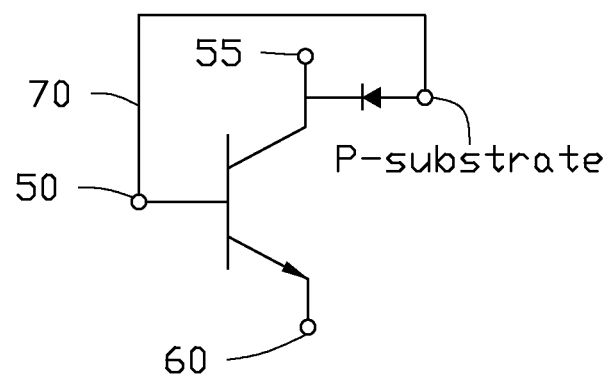
FIGS. 3A and 3B are schematic diagrams of a bipolar phototransistor with body strapped base showing metallic material and doping connection as the strap.
Figure 3B:
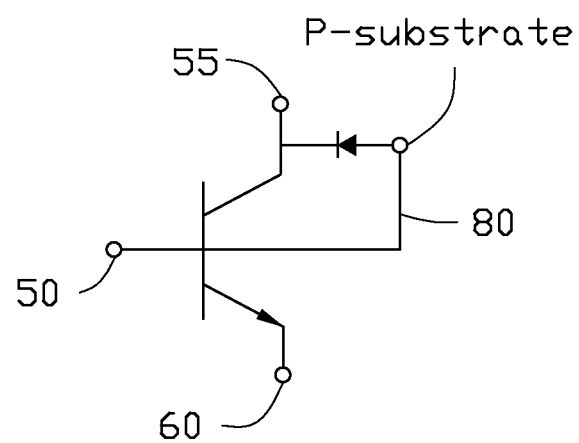

Schematic views of the phototransistor 1 are shown in FIGS. 3A and 3B. As can be seen in these figures, the phototransistor 1 is a bipolar transistor having a base terminal 50, a collector terminal 55, an emitter terminal 60, and a p-substrate terminal. In FIG. 3A, one aspect is shown whereby the p-substrate terminal is tied or strapped or electrically connected to the base terminal 50 by metal-wire connection 70. In FIG. 3B, another aspect is shown whereby the p-substrate terminal is tied or strapped or electrically connected to the base terminal 50 using high doping semiconductor connection 80.

Figure 4:
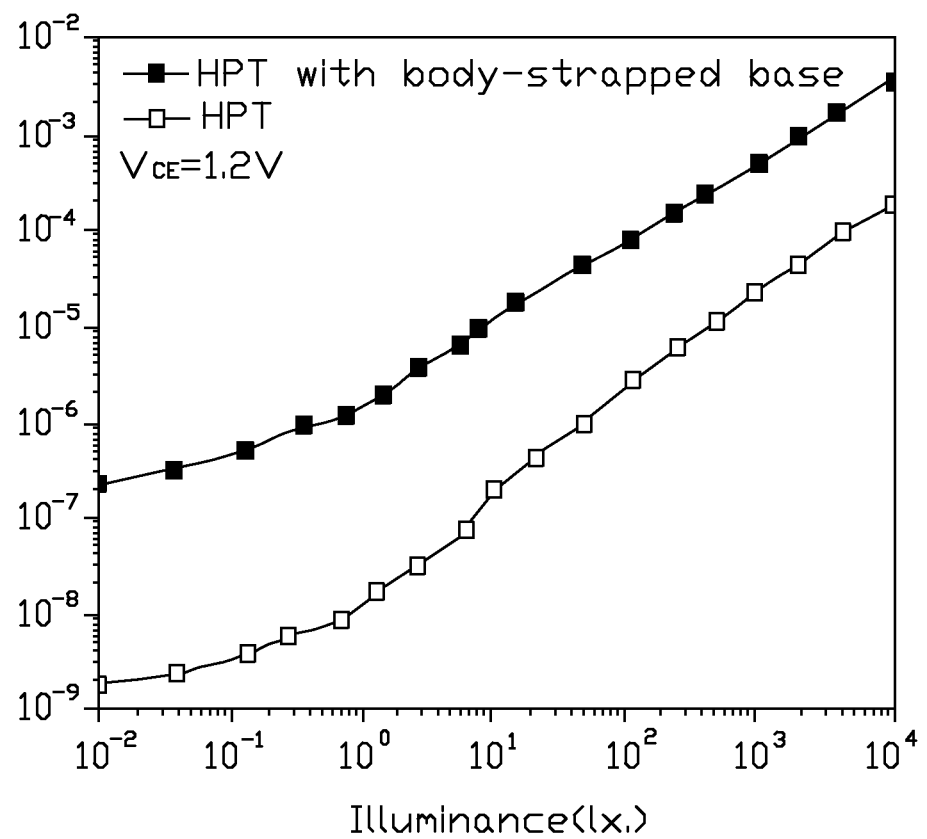
FIG. 4 is a graph of photocurrents of the phototransistor with and without the body-strapped base under illuminance.

FIG. 4 shows the characteristics of phototransistor 1 of photocurrent against illuminance under the illumination of a white light source. Under a small bias voltage (VCE=1.2 V), the normal SiGe HPT without body-strapped base already shows remarkable collector output current. For a wide dynamic range (120 dB) of input light illuminance, the output current shows a relatively linear behavior. In particular, when the illuminance is as low as 0.01 lux, the output current from the 60 μm×60 μm phototransistor 1 device is still as high as 1.7 nA, which corresponds to a current density of 47.2 μA/cm2. The measured dark current of the device is only 1.7 pA (i.e. 0.0472 μA/cm2 in current density). The signal-to-noise ratio of the normal SiGe HPT is approximately 60 dB at 0.01 lux illuminance.

For the SiGe HPT with body-strapped base, similar linear characteristic is observed as shown in FIG. 4. Note that the current has been enlarged by two orders of magnitude, compared with that of the normal SiGe HPT without body-strapping. The current value reaches 0.2 μA at 0.01 lux. This proves the effectiveness of this disclosure. More importantly, the dark current of the device remains very small, only 18 pA (0.5 μA/cm2 in current density) at VCE=1.2 V. The sensitivity of the HPT with body-strapped base can be very high and the signal-to-noise ratio is improved to 80 dB from 60 dB at 0.01 lux illuminance.

Figure 5:
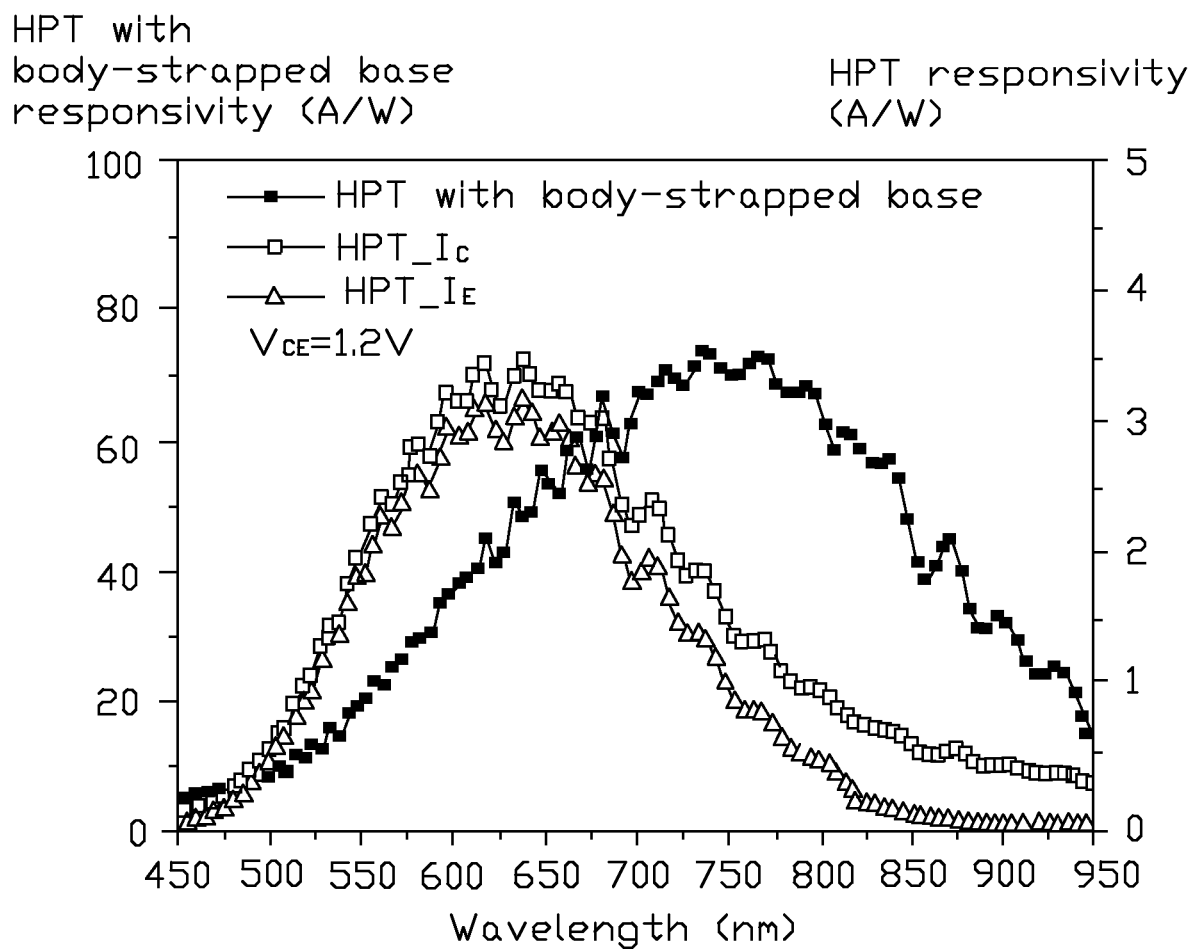
FIG. 5 is a graph showing spectral photo-responsivities of normal silicon-germanium (SiGe) BiCMOS heterojunction bipolar phototransistor (HPT) and the SiGe BiCMOS HPT with body-strapped base.

As shown in FIG. 5, the measured spectral photo-responsivity of the normal SiGe HPT under VCE=1.2 V has a peak value around 3.7 A/W for collector current (IC) and the spectral peak lies around λ=630 nm. The parasitic N+ buried layer/p-sub junction under the HPT is an additional photo-detecting junction and it contributes to the collector current (IC). Although this additional photocurrent is not amplified by the HBT, its magnitude can be significant when the wavelength of the incident light is long, because the depletion region of the junction is wide and the substrate is thick. Therefore, the magnitude of collector current (IC) is usually larger than that of emitter current (IE) when the HPT is illuminated by long-wavelength light. As can be seen in FIG. 5, the two curves for IC and IE coincide more or less in the shorter wavelength region but separate significantly in the longer wavelength region. Apparently, collector current (IC) is larger than emitter current (IE) in FIG. 5. Because long-wavelength light generates more holes in the substrate than short-wavelength light does, it can be expected that the spectral response of the SiGe HPT with body-strapped base should have a peak at a longer wavelength. FIG. 5 shows that the responsivity of HPT has been enhanced by the body-strapping. The peak responsivity reaches a value about 75 A/W.

Figure 6:
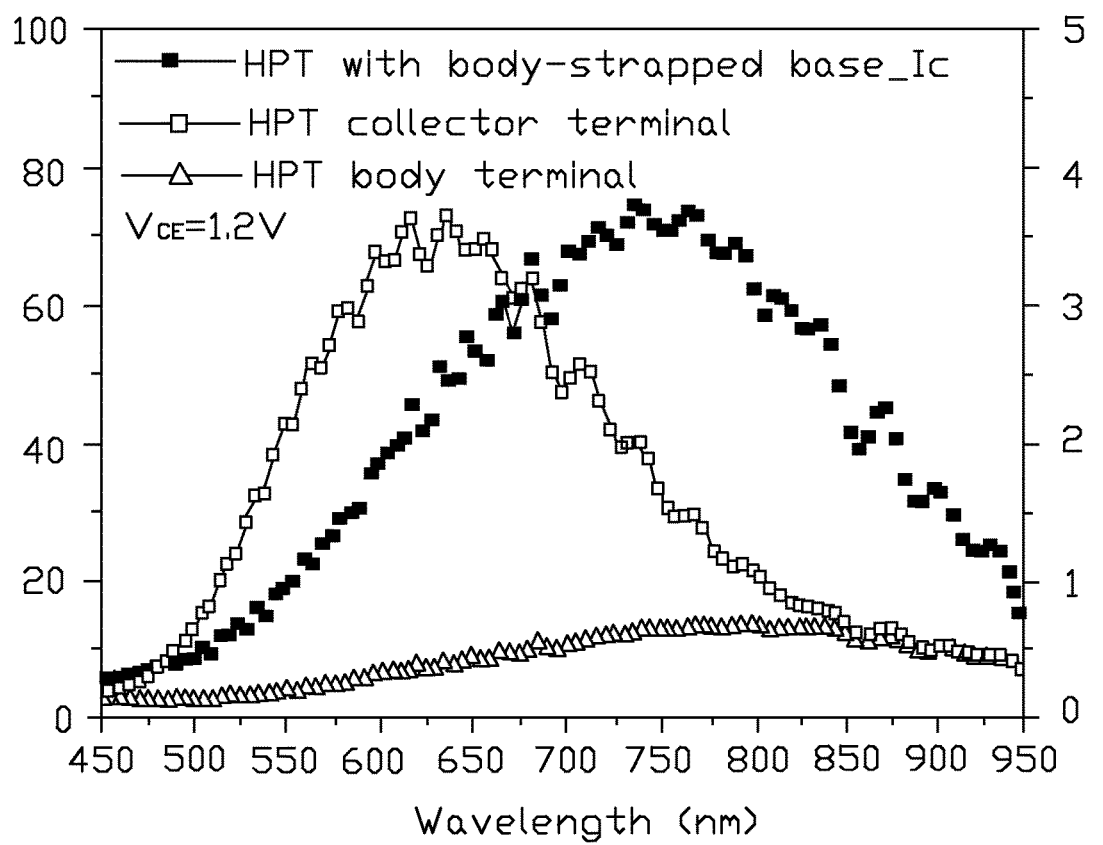
FIG. 6 is a graph showing spectral responsivities of the SiGe BiMOS HPT with body-strapped base, the collector current of normal HPT, and the substrate current of normal HPT.

As shown in FIG. 6, the spectral photo-responsivity is compared with the ones in FIG. 5. It is clear that the spectral peak of the HPT substrate current (hole current) lies at a longer wavelength than the spectral peak position of the HPT collector current, and it coincides with the location of the spectral peak of the HPT with body-strapped base. That is, the substrate carriers provide a self-bias to the HPT and induce more output current.

Figure 7:
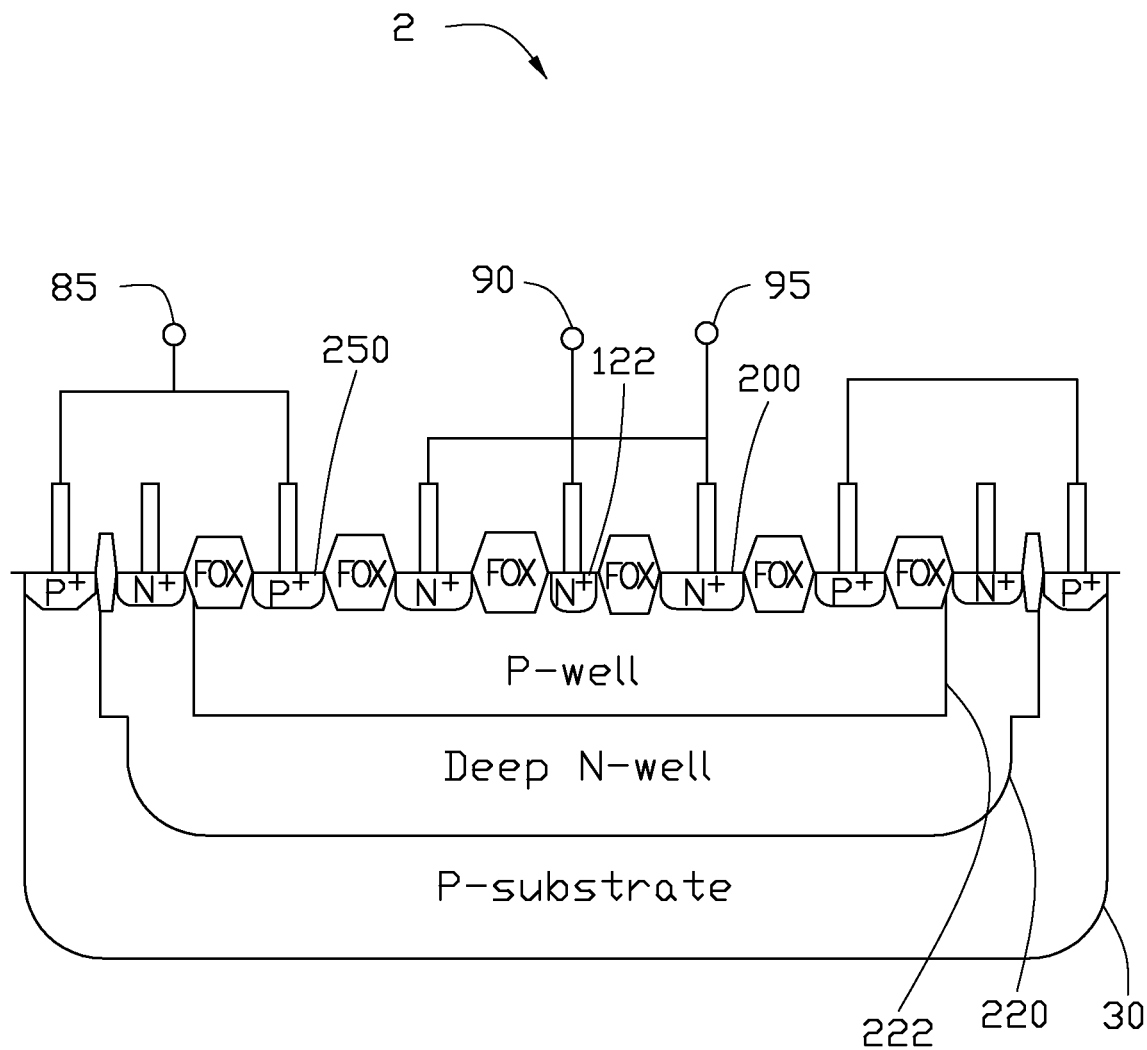
FIG. 7 shows a cross-sectional diagram of a CMOS phototransistor with body-strapped base utilizing metal connections in accordance with one embodiment of the disclosure.

FIG. 7 contains a cross-sectional view of one embodiment of a photodetector comprising a phototransistor 2 of the present disclosure. The process of fabricating the phototransistor 2 is the standard CMOS process. The phototransistor 2 is a lateral NPN bipolar junction transistor constructed by emitter region 122, a base region 250, and a collector region 200. The phototransistor 2 is disposed in a p-well 222. The p-substrate region 30 is isolated from the p-well 222 by a deep n-well 220. FIG. 7 shows base terminal 85 which has been electrically connected to the substrate terminal, collector terminal 95, and emitter terminal 90.

Figure 8A:
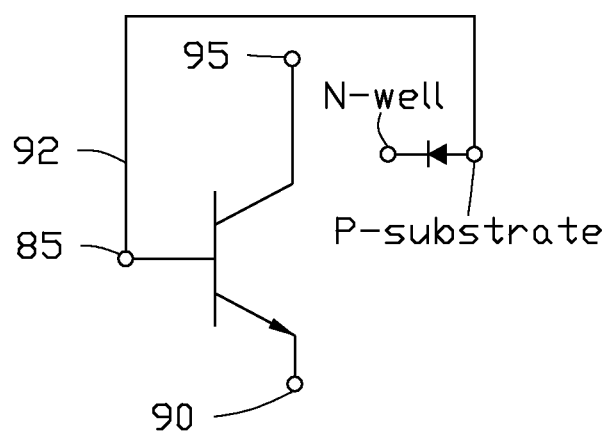
FIGS. 8A and 8B are circuit diagrams of the SiGe CMOS HPT with body-strapped base by utilizing metal wire and doping connections in a CMOS process.
Figure 8B:
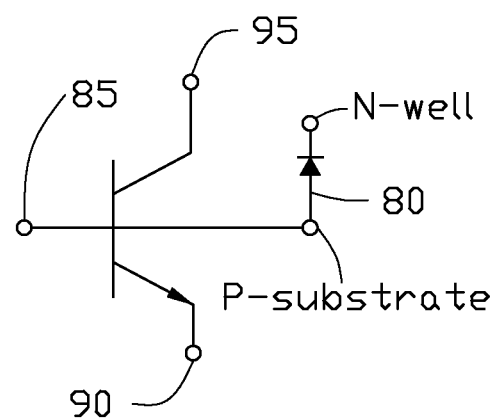

Schematic views of the phototransistor 2 are shown in FIGS. 8A and 8B. In FIG. 8A, one aspect is shown whereby the p-substrate terminal is electrically connected to the base terminal 85 using metal-wire connection 92. As is apparent, the deep n-well 220 isolates the p-substrate 30 from the phototransistor 2 and no internal electrical connection is between the base 85 and the p-substrate terminal. In FIG. 8B, another aspect is shown whereby the p-substrate terminal is electrically connected to the base terminal 85 using high doping semiconductor connection 80.

Figure 9:
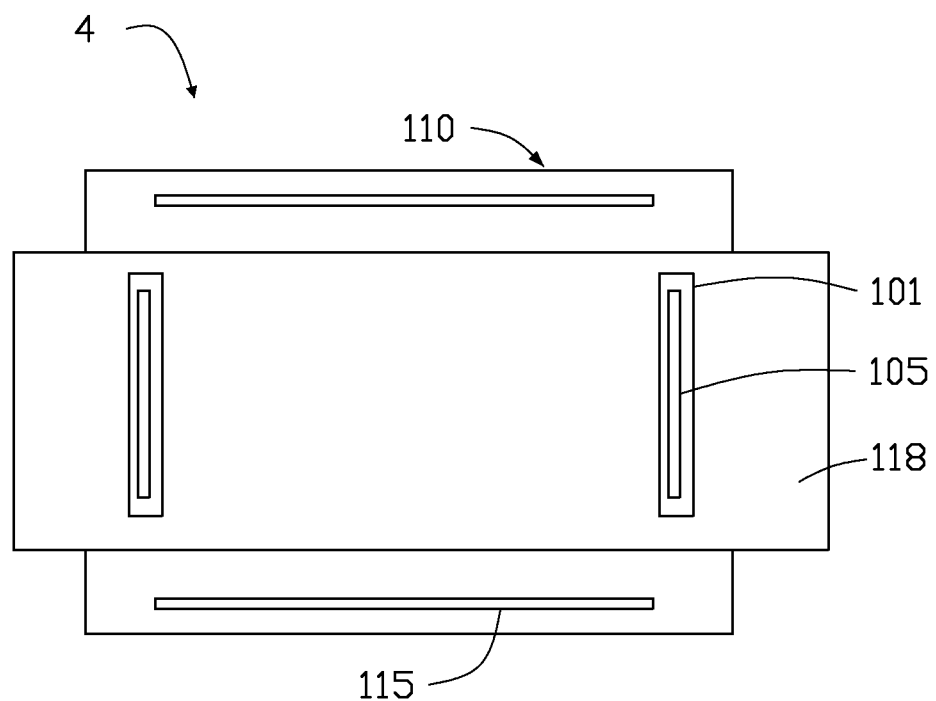
FIG. 9 shows a top view of the SiGe BiCMOS HPT with body-strapped base by utilizing extended base in accordance with one embodiment of the disclosure.

FIG. 9 is a top plan view of one embodiment of a photodetector comprising a phototransistor 4 of the present disclosure. The substrate terminal (not shown) is directly electrically connected to the base region 118. As shown in FIG. 9, the ends of the base region 118 overlaps or extends over the collector region 110 and is directly electrically connected to the substrate using high-concentration doping. The high-concentration doping region is directly physically connecting the base region 118 without any metal contacts or wires. The emitter regions 101, the emitter contacts 105 and the collector contacts 115 are also shown in FIG. 9.

Figure 10:
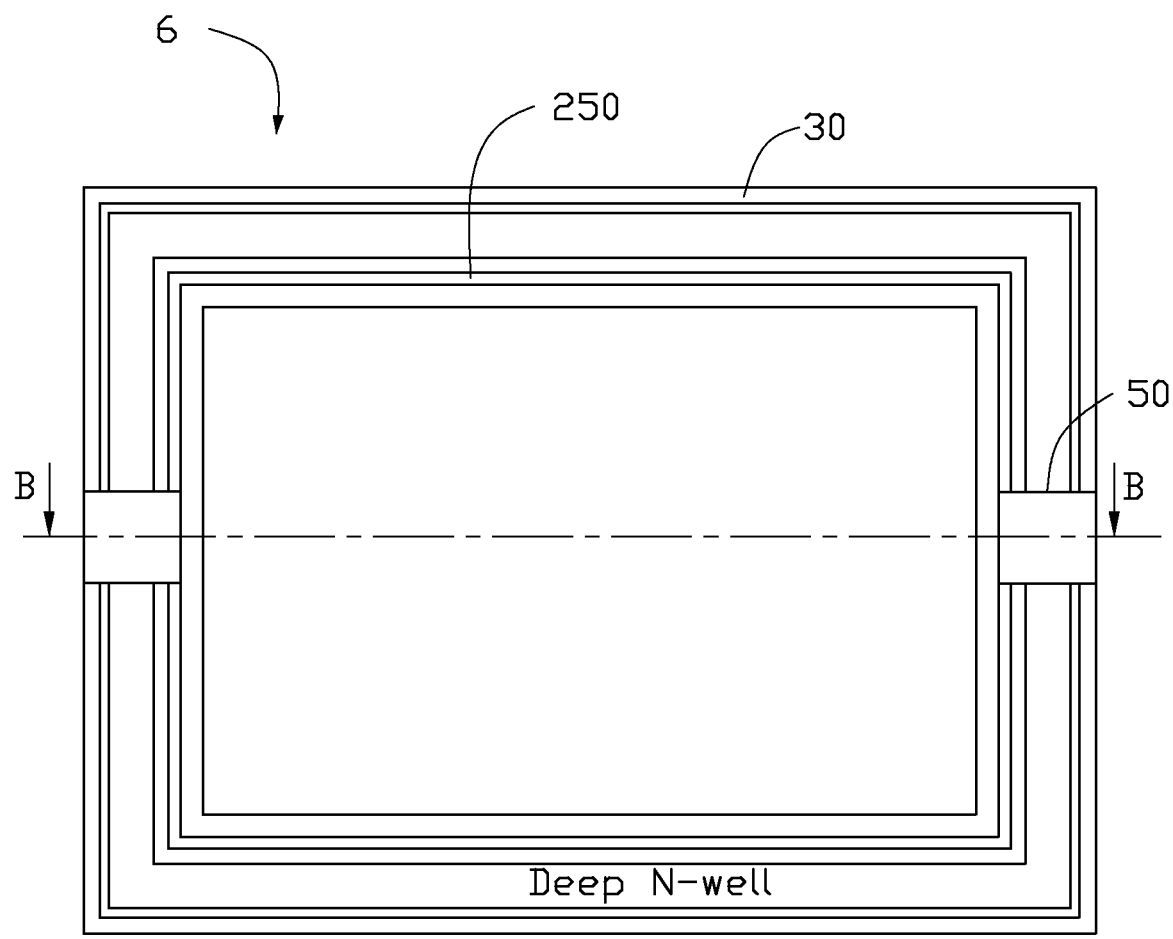
FIG. 10 is a top plan view of the CMOS PT with NMOS FET devices and body-strapped base by utilizing metal connections in accordance with one embodiment of the disclosure.
Figure 11:
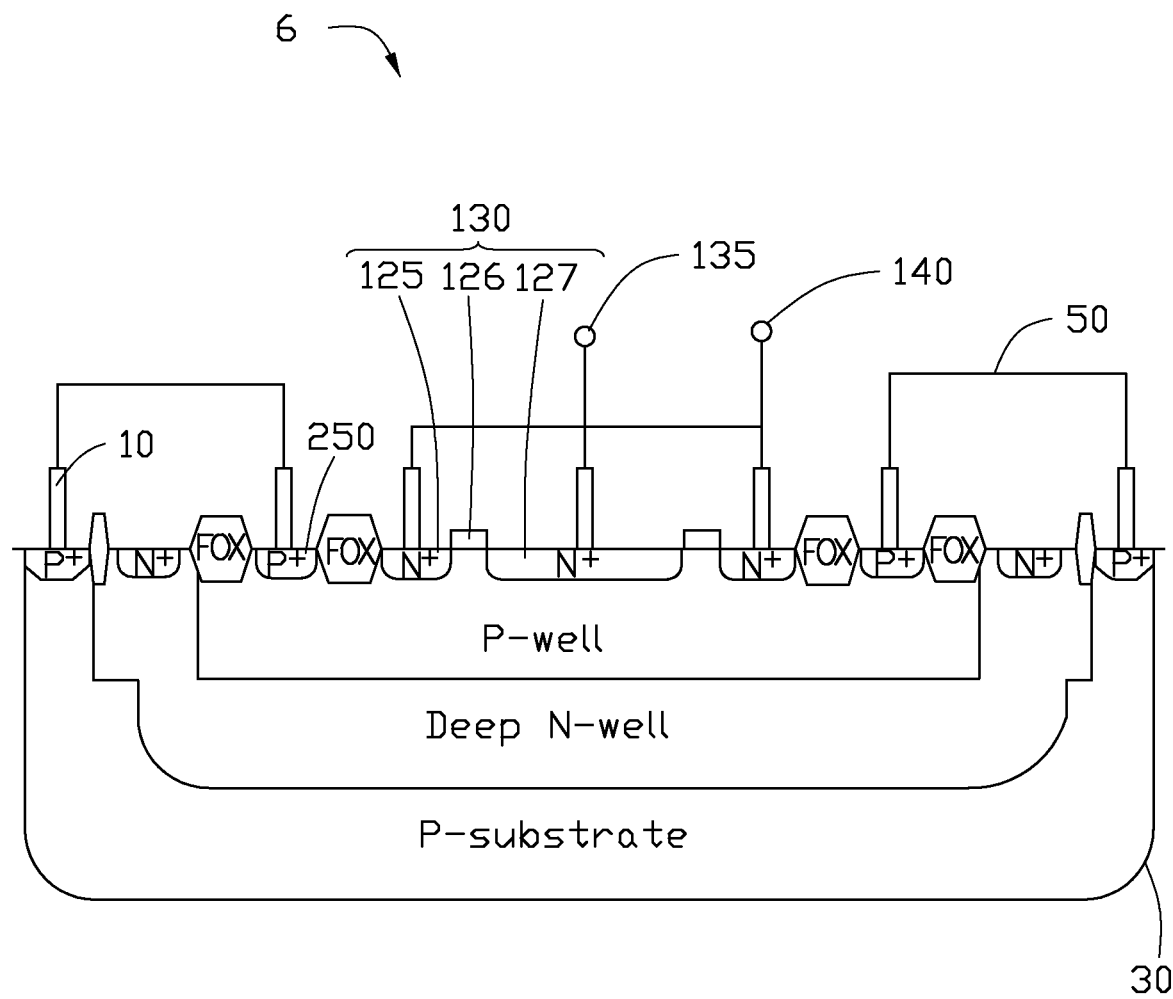
FIG. 11 is a cross-sectional diagram taken along line B-B of FIG. 10.

FIGS. 10 and 11 show one embodiment of a photodetector comprising a phototransistor 6 of the present disclosure. FIG. 10 shows a top plan view of the phototransistor 6. FIG. 11 shows a cross-sectional view taken along line B-B of FIG. 10. This embodiment is similar to the embodiment as shown in FIG. 7, however, instead of field oxides, the collector regions 127 and the emitter regions 125 are separated by NMOS FETs 130. The drains/sources regions of the NMOS FET serve as the collector regions 127 and the emitter regions 125. The NMOS FETs 130 are fabricated with a minimum channel length rule in standard semiconductor process to reduce the distance between the collector region 127 and the emitter region 125 of the phototransistor 6. The substrate region 30 is electrically connected to the base region 250 using metal interconnects 50. Gate 126 of NMOS FET 130 is shown in FIG. 11 and it is floating when the phototransistor 6 is operated as a two-terminal device. Base regions 250 are separated from emitter regions 125 by field oxide FOX.

Figure 12:
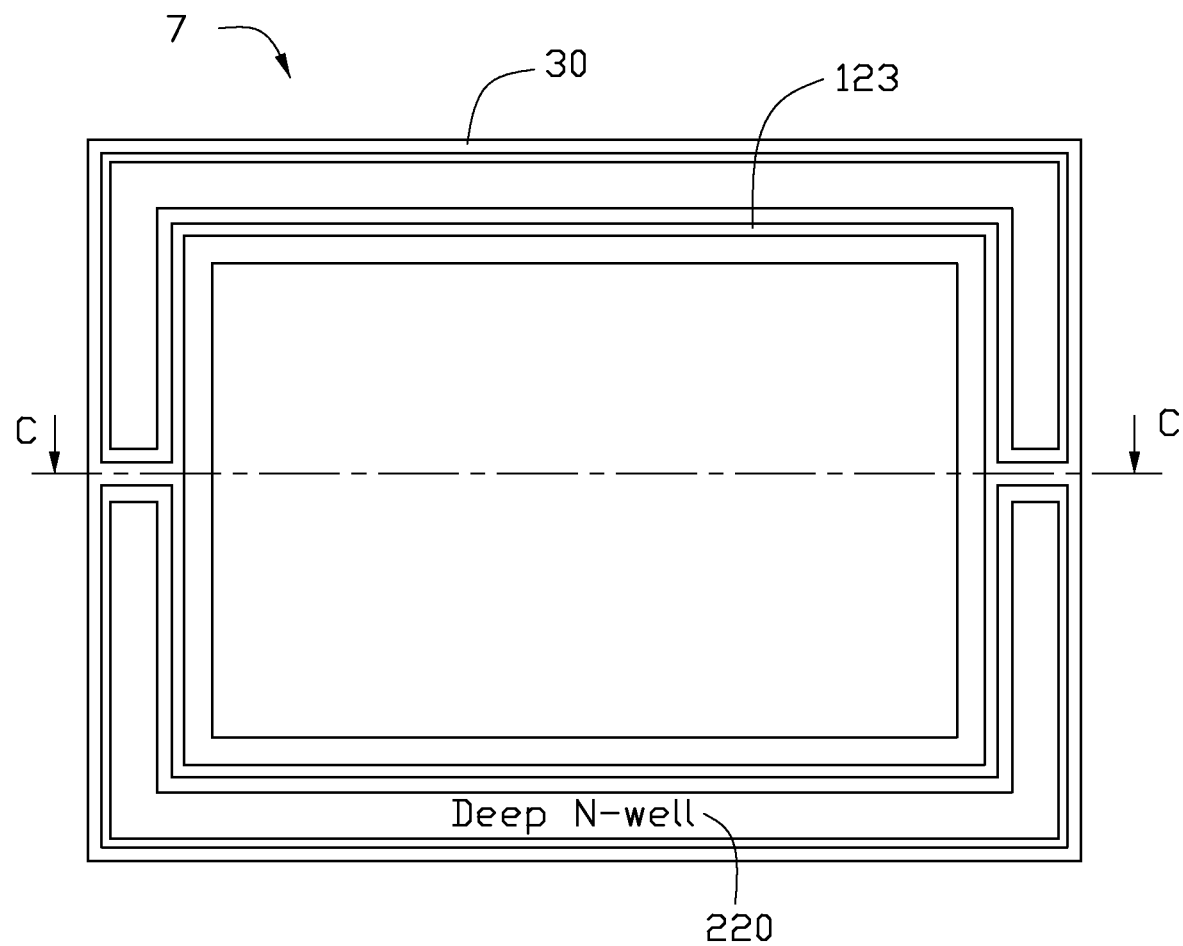
FIG. 12 is a top plan view of the CMOS PT with NMOS FET devices and body-strapped base of an embodiment of the disclosure.
Figure 13:
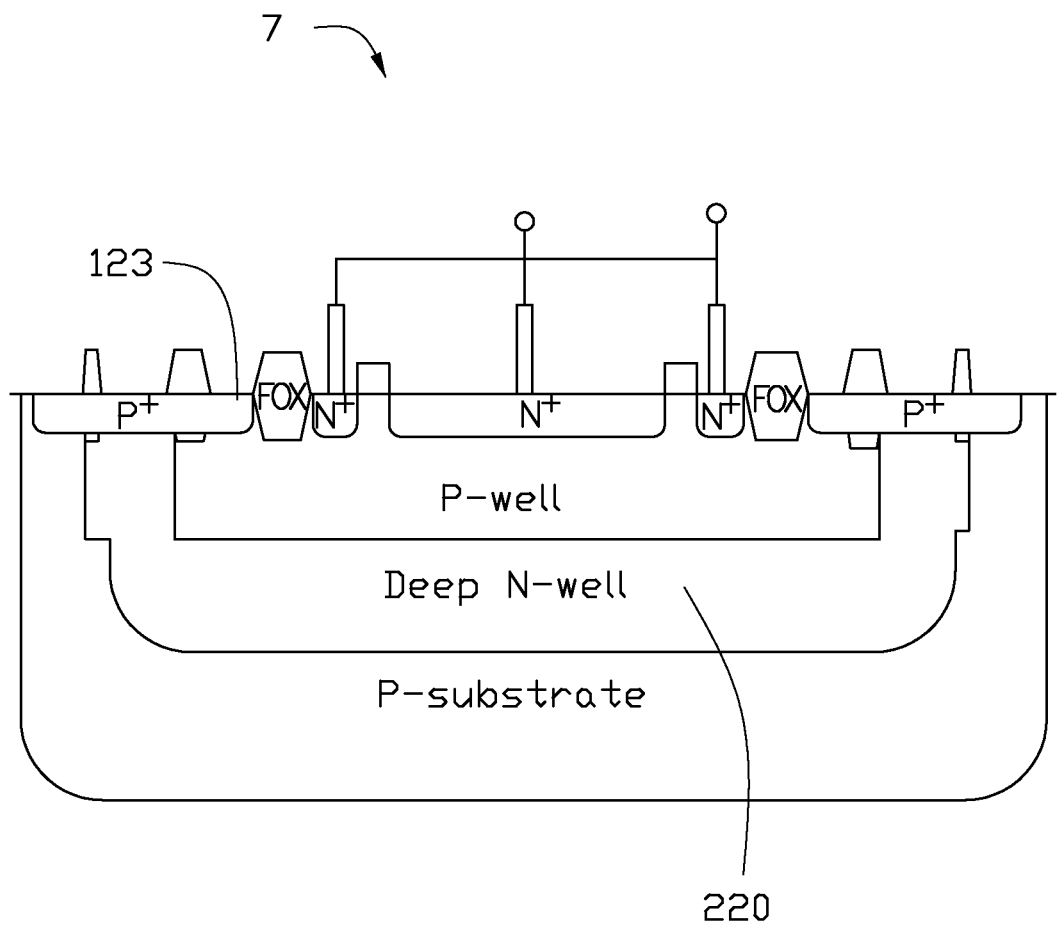
FIG. 13 is a cross-sectional diagram taken along line C-C of FIG. 12.

FIGS. 12 and 13 show one embodiment of a photodetector comprising a phototransistor 7 of the present disclosure. FIG. 12 shows a top plan view of the phototransistor 7. FIG. 13 shows a cross-sectional view taken along line C-C of FIG. 12. This embodiment is similar to the embodiment as shown in FIGS. 10 and 11; however, the base region 123 is directly connected to the substrate region 30 through the isolation region deep n-well 220 by high-concentration doping.

Figure 14:
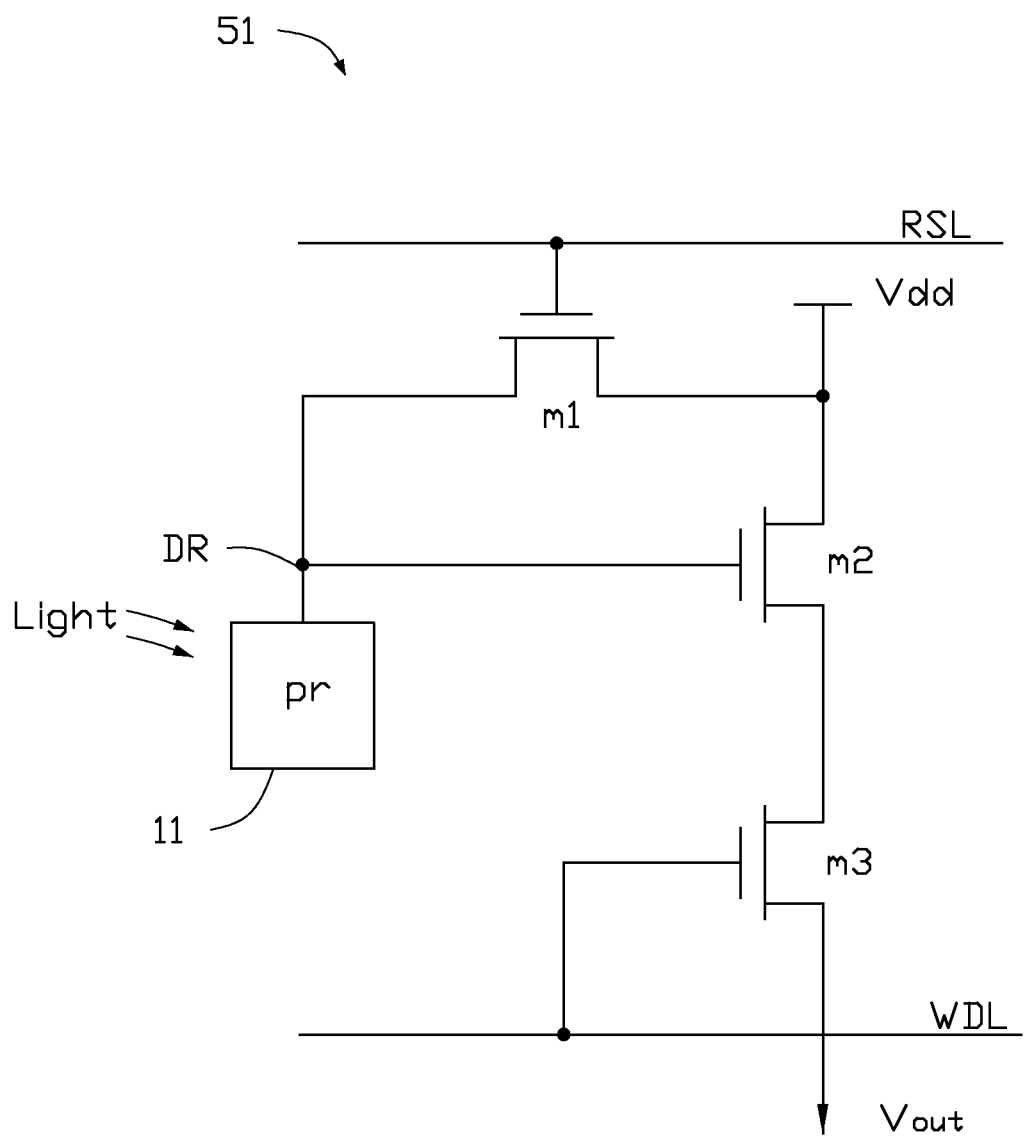
FIG. 14 shows a schematic diagram of an image sensor utilizing a phototransistor in accordance with one embodiment of the disclosure.

In one embodiment of the present disclosure, the photodetector comprising a phototransistor may be implemented as a pixel in an image sensor as shown in FIG. 14. FIG. 14 is a simplified view of an image sensor pixel 51 having the phototransistor of the present disclosure. Incident light is captured by the phototransistor 11 and an electrical signal in the form of electrical charges is present in the floating node DR of the image sensor pixel 51. The transistor M1 is used to reset any charges accumulated in the floating node DR to a reference level. The gate of transistor M1 is connected to a reset line RSL. A source follower amplifier M2 is used to buffer the output of the image sensor pixel 51. A select transistor M3 passes the output signal Vout. The gate of the select transistor M3 is connected to a word line WDL.

Figure 15:
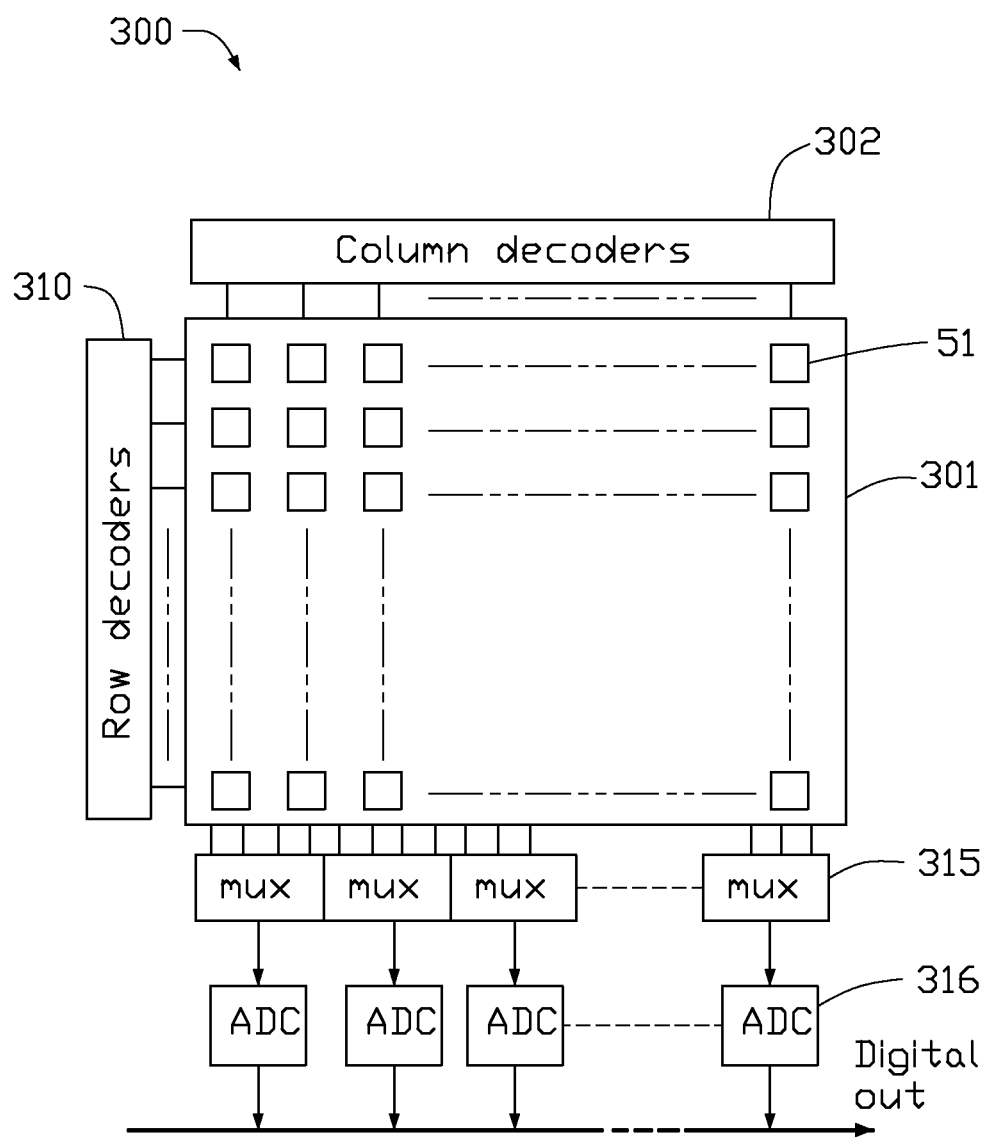
FIG. 15 shows a schematic block diagram of a module using the phototransistor in accordance with an embodiment of the present disclosure.
Figure 16:
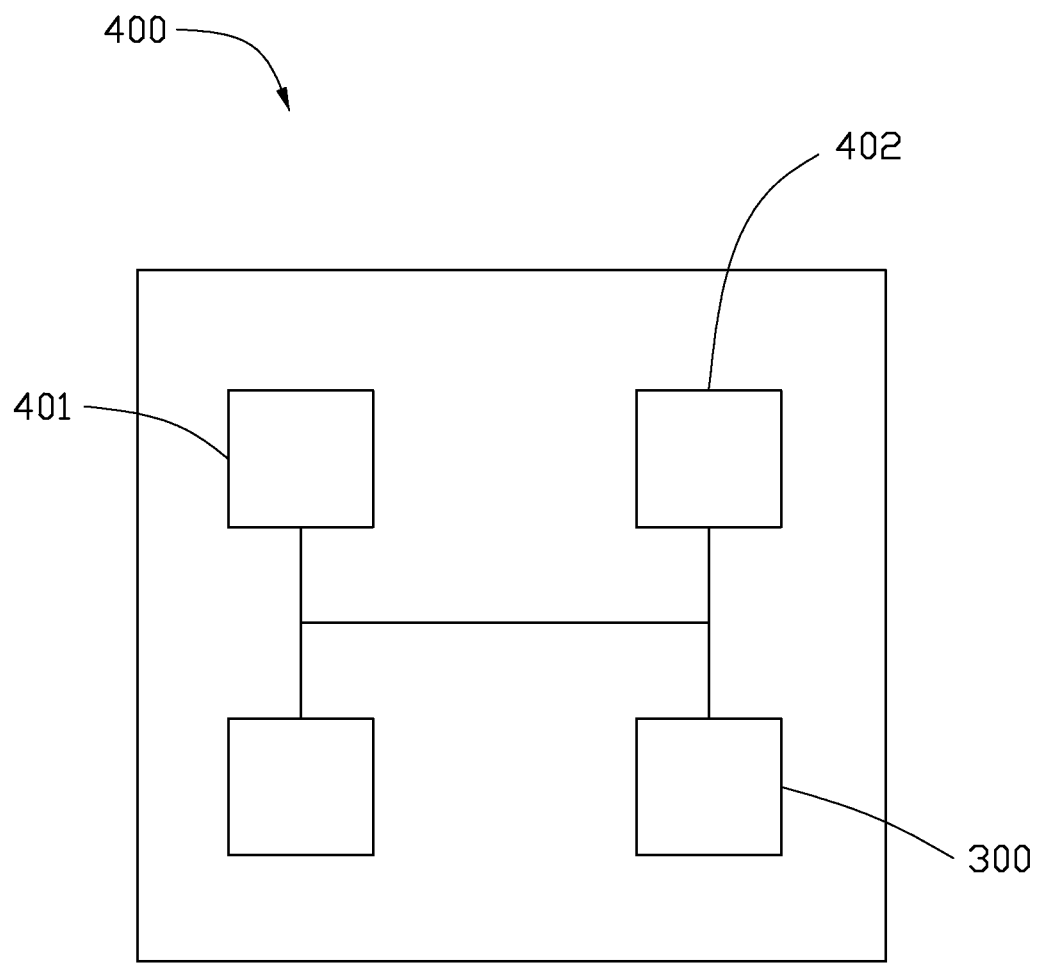
FIG. 16 shows a block diagram of a system using the phototransistor in accordance with an embodiment of the present disclosure.

In one embodiment of the present disclosure, as shown in FIG. 15, an image sensor module 300 comprising a plurality of phototransistors may be implemented in a plurality of image sensor pixels 51 as an array comprising rows and columns. In an alternative embodiment, the array may comprise of one row and multiple columns or one column and multiple rows. The image sensor array 301, shown in FIG. 15, is connected to row decoders 310, column decoders 302, multiplexers 315, analog-to-digital converters (ADC) 316 to extract the electrical signal (information) from each image sensor pixel. In a further embodiment, as shown in FIG. 16, the image sensor module 300 is part of a system 400 where the extracted electrical signal from each image sensor pixel is processed and/or displayed on a display screen 401 and/or stored in a storage unit 402 of the system 400.

Figure 17:
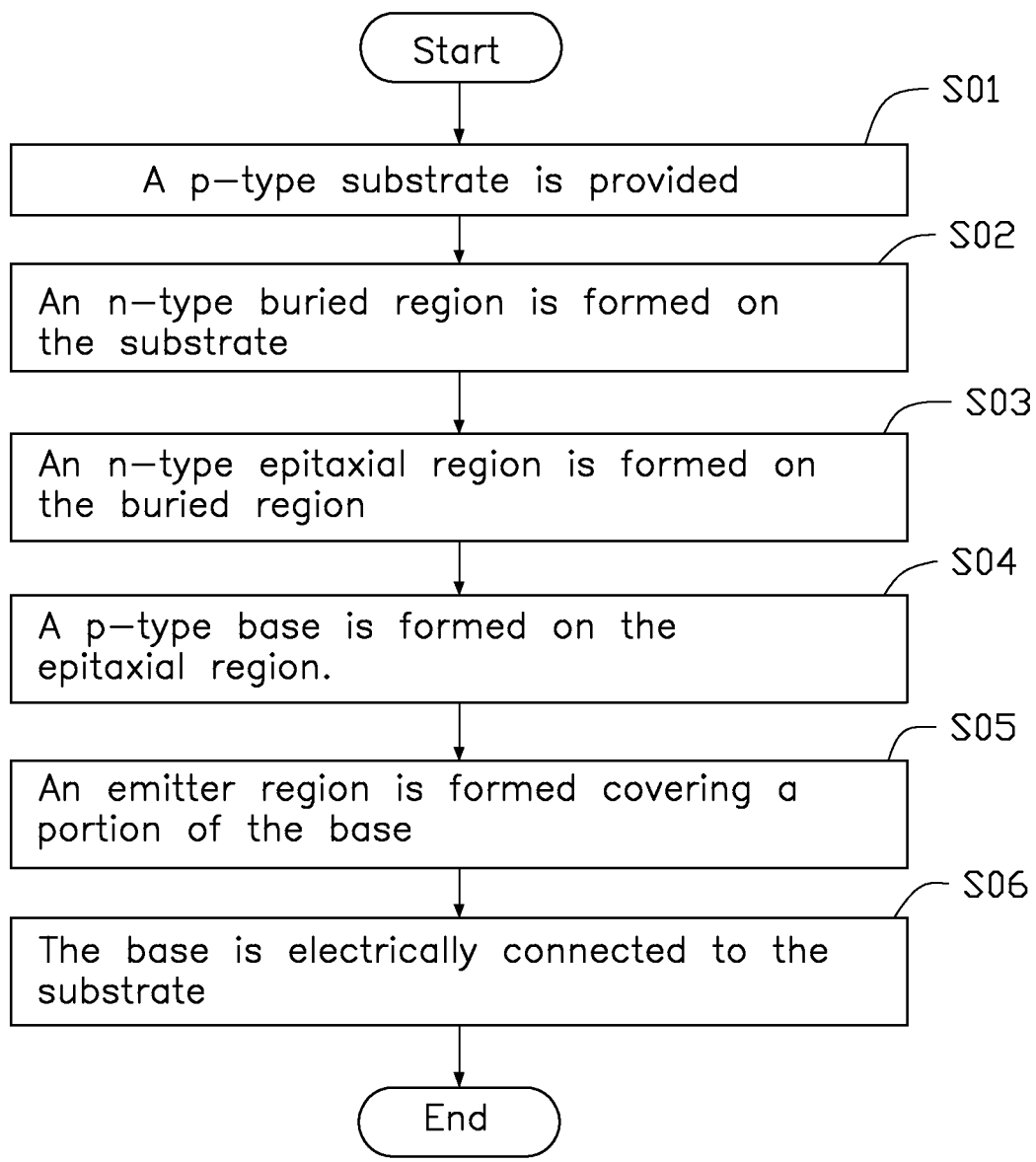
FIG. 17 illustrates a flowchart of one embodiment of fabricating a photodetector comprising a phototransistor.

FIG. 17 illustrates a flowchart of one embodiment of a method of fabricating a photodetector comprising a phototransistor. Depending on the embodiment, additional steps in FIG. 17 may be added, others removed, and the ordering of the steps may be changed.

In step S01, a p-type substrate is provided.

In step S02, an n-type buried region is formed on the substrate.

In step S03, an n-type epitaxial region is formed on the buried region.

In step S04, a p-type base is formed on the epitaxial region.

In step S05, an emitter region is formed covering a portion of the base.

In step S06, the base is electrically connected to the substrate.

Figure 18:
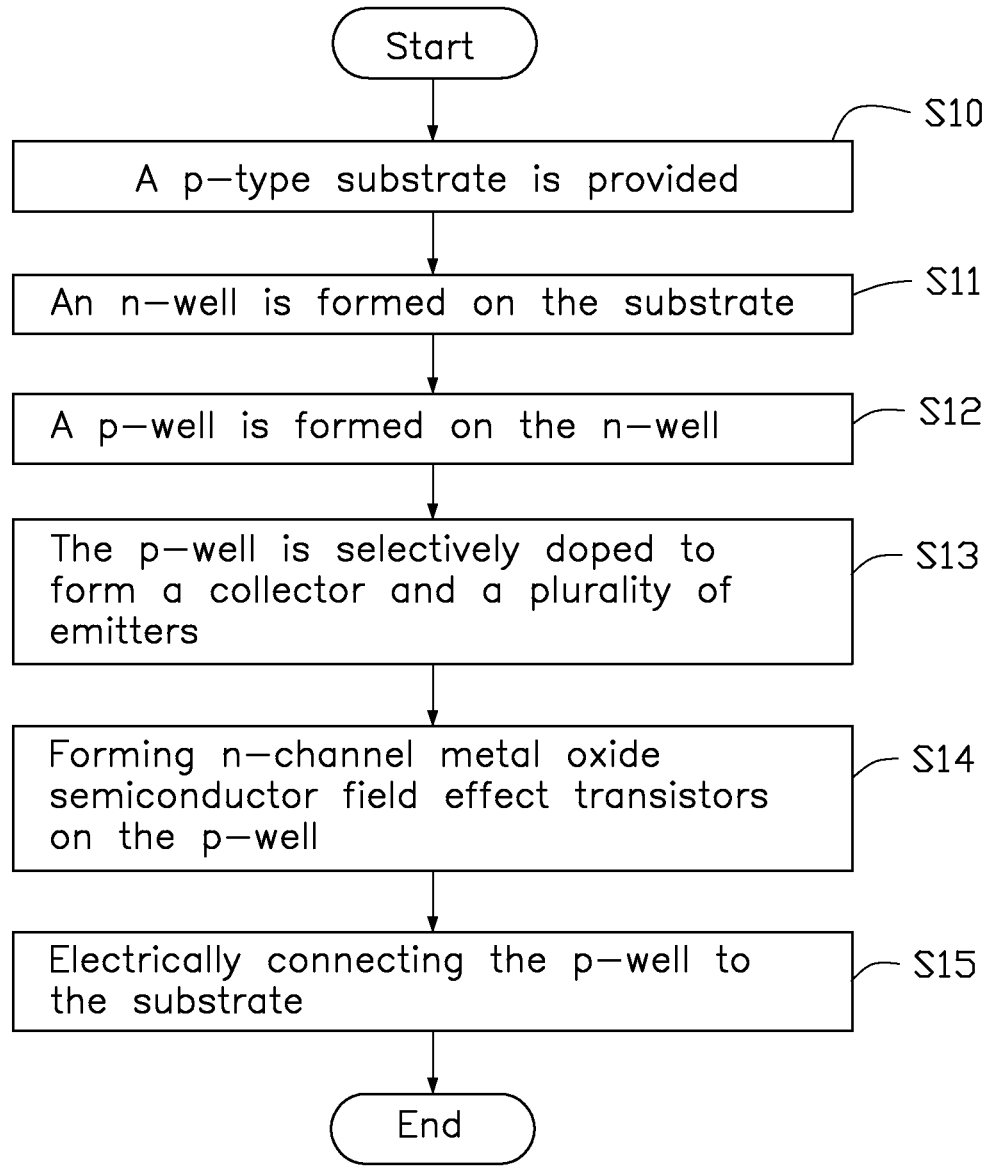
FIG. 18 illustrates a flowchart of one embodiment of fabricating a photodetector comprising a phototransistor.

FIG. 18 illustrates a flowchart of one embodiment of a method of fabricating a photodetector comprising a phototransistor. Depending on the embodiment, additional steps in FIG. 18 may be added, others removed, and the ordering of the steps may be changed.

In step S10, a p-type substrate is provided.

In step S11, an n-well is formed on the substrate.

In step S12, a p-well is formed on the n-well.

In step S13, the p-well is selectively doped to form a collector and a plurality of emitters.

In steps S14, forming n-channel metal oxide semiconductor field effect transistors on the p-well.

In step S15, electrically connecting the p-well to the substrate.

The described embodiments are merely possible examples of implementations, set forth for a clear understanding of the principles of the present disclosure. Many variations and modifications may be made without departing substantially from the spirit and principles of the present disclosure. All such modifications and variations are intended to be comprised herein within the scope of this disclosure and the described inventive embodiments, and the present disclosure is protected by the following claims.

What is claimed is:

1. A photodetector structure, comprising:
   a substrate;
   at least one phototransistor, the at least one phototransistor having a base, the base is directly connected to a metal interconnect through which the base is electrically connected to the substrate, but physically separated from the substrate; and
   an n-type conductivity region adjacent to the substrate, wherein the substrate is of p-type conductivity, the at least one phototransistor is formed on the n-type conductivity region, and the metal interconnect is physically separated from the n-type conductivity region.

2. The photodetector structure according to claim 1, wherein a collector region and an emitter region are formed in the p-type conductivity region and separated by an n-channel metal oxide field effect transistor (nMOS FET).

3. The photodetector structure according to claim 1, wherein the at least one phototransistor is a plurality of phototransistors arranged in a one dimensional array.

4. The photodetector structure according to claim 1, wherein the at least one phototransistor is a plurality of phototransistors arranged in a two dimensional array.

5. The photodetector structure according to claim 1, wherein the photodetector structure is an electronic module, the at least one phototransistor is a plurality of phototransistors arranged in a matrix, and the at least one, phototransistor is connected to a multiplexer and a row and column decoder.

6. A method for fabricating a photodetector structure, comprising:
   forming an n-type buried layer on a p-type substrate;
   forming an n-type epitaxial layer of the buried layer;
   forming a p-type base layer on the epitaxial layer;
   forming an n-type emitter layer on a portion of the base layer; and
   forming a metal interconnect directly in contact with the base layer through which the base is electrically connected to the substrate,
   wherein the metal interconnect is physically separated from the buried layer and the epitaxial layer.

7. A photosensitive device, comprising:
   a substrate of a first conductivity type;
   a buried layer of a second conductivity type adjacent to the substrate; and
   at least one phototransistor, comprising a base of the first conductivity type,
   wherein the base layer is directly connected to a metal interconnect through which the base is electrically connected to the substrate, but physically separated from the substrate, and the metal interconnect is physically separated from the buried layer of the second conductivity type.

8. The photosensitive device according to claim 7, wherein the at least one phototransistor is a plurality of phototransistors arranged in a one dimensional array.

9. The photosensitive device according to claim 7, wherein the at least one phototransistor is a plurality of phototransistors arranged in a two dimensional array.

10. A semiconducting device, comprising:
    a substrate; and
    a two terminal light sensitive transistor comprising a base and a buried layer of n-type conductivity;
    wherein the base is directly connected to a metal interconnect through which the base is electrically connected to the substrate, but physically separated from the substrate, the substrate is of p-type conductivity, the base is of p-type conductivity, and the metal interconnect is physically separated from the buried layer of n-type conductivity.

11. The semiconducting device according to claim 10, wherein the base and the substrate are floating.

12. The semiconducting device of claim 10, wherein the base is separated from the substrate by the buried layer and an n-type conductivity epitaxial region.

* * * * *